United States Patent
See et al.

(10) Patent No.: US 7,243,185 B2
(45) Date of Patent: Jul. 10, 2007

(54) FLASH MEMORY SYSTEM WITH A HIGH-SPEED FLASH CONTROLLER

(75) Inventors: Sun-Teck See, San Jose, CA (US);
Tzu-Yih Chu, San Jose, CA (US);
Horng-Yee Chou, Palo Alto, CA (US);
Charles C. Lee, Sunnyvale, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 474 days.

(21) Appl. No.: 10/818,653

(22) Filed: Apr. 5, 2004

(65) Prior Publication Data

US 2005/0223158 A1    Oct. 6, 2005

(51) Int. Cl.
*G06F 12/00* (2006.01)

(52) U.S. Cl. .......... 711/103; 711/154; 711/158; 711/167; 365/185.33

(58) Field of Classification Search .......... 711/103, 711/154, 158, 167; 365/185.33
See application file for complete search history.

(56) References Cited

U.S. PATENT DOCUMENTS

| 5,745,884 | A |   | 4/1998 | Carnegie et al. |
| 5,822,251 | A | * | 10/1998 | Bruce et al. ........... 365/185.33 |
| 5,946,714 | A | * | 8/1999 | Miyauchi ................ 711/205 |
| 6,034,897 | A | * | 3/2000 | Estakhri et al. ........ 365/185.33 |
| 6,119,245 | A | * | 9/2000 | Hiratsuka ................... 714/7 |
| 6,145,050 | A | * | 11/2000 | Kaki et al. ............... 711/103 |
| 7,009,846 | B1 | * | 3/2006 | Wang et al. ............. 361/737 |
| 2003/0046483 | A1 | * | 3/2003 | Moschopoulos ........... 711/103 |
| 2005/0160218 | A1 | * | 7/2005 | See et al. ................. 711/103 |

FOREIGN PATENT DOCUMENTS

WO    WO 00/62523    10/2000

OTHER PUBLICATIONS

European Search Report dated Apr. 26, 2004 related to European Patent Application No. 03104711.1.

* cited by examiner

*Primary Examiner*—Stephen C. Elmore
(74) *Attorney, Agent, or Firm*—Bever, Hoffman & Harms, LLP; Patrick T. Bever

(57) ABSTRACT

A multi media card (MMC) is disclosed. The MMC includes a flash controller and at least one flash memory device. The flash controller increases the throughput of the at least one flash memory device to match the speed of a host bus coupled to the MMC. The flash controller increases the throughput by performing one or more of performing a read-ahead memory read operation, performing a write-ahead memory write operation, increasing the size of a page register of the at least one flash memory device, increasing the width of a memory data bus, performing a dual-channel concurrent memory read operation, performing a dual-channel concurrent memory write operation, performing a write-cache memory write operation, and any combination thereof.

20 Claims, 6 Drawing Sheets

FLASH MEMORY SYSTEM WITH A HIGH-SPEED FLASH CONTROLLER

FIELD OF THE INVENTION

The present invention relates to flash memory systems, and more particularly to a flash memory system with a high-speed flash controller.

BACKGROUND OF THE INVENTION

A multi media card (MMC) is a popular memory card used in portable host devices such as cell phones, digital cameras, personal digital assistants (PDAs), global positioning systems (GPSs), digital audio players, digital video games, etc.

The conventional MMC system specification version 3.xx defines the MMC as a memory card with a form factor of 32 mm×24 mm×1.4 mm, and 7-pin contacts for electrical connection to a host. The MMC includes of a flash controller and a flash memory device. At an operating frequency of 20 Mhz the host is able to access the MMC with a transfer speed of 20 Mhz×1-bit=20 Mb/s=2.5 MB/s for both read and write operations.

However, the conventional MMC in the market performs read operations at speeds lower than 2 MB/s and write operations at speeds even lower than 1 MB/s. The flash controller performance clearly has room to be optimized to raise the transfer rate.

Due to a higher transfer rate requirement from host devices, the MMC system specification 4.0 has updated the MMC with 4-bit and 8-bit options in addition to the original 1-bit host data bus. With the wider host bus, the host transfer rate is further increased substantially, for example:

Transfer Rate (4 bits, at 20 Mhz)=20 Mhz×4 bits=80 Mb/s=10 MB/s,

Transfer Rate (8 bits, at 20 Mhz)=20 Mhz×8 bits=160 Mb/s=20 MB/s.

A problem with the conventional MMCs is that it uses a conventional flash controller, which has a throughput that does not match the capability of the host bus.

Accordingly, what is needed is an improved flash memory system, which includes a high-speed flash controller that overcomes the above-identified problems. The present invention addresses such a need.

SUMMARY OF THE INVENTION

A multi media card (MMC) is disclosed. The MMC comprises a flash controller and at least one flash memory device. The flash controller increases the throughput of the at least one flash memory device to match the speed of a host bus coupled to the MMC. The flash controller increases the throughput by performing one or more of performing a read-ahead memory read operation, performing a write-ahead memory write operation, increasing the size of a page register of the at least one flash memory device, increasing the width of a memory data bus, performing a dual-channel concurrent memory read operation, performing a dual-channel concurrent memory write operation, performing a write-cache memory write operation, and any combination thereof.

DETAILED DESCRIPTION OF THE INVENTION

The present invention relates to flash memory systems, and more particularly to a flash memory system with a high-speed flash controller. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A system and method in accordance with the present invention for providing a multi media card (MMC) is disclosed. The MMC comprises a flash controller and one or more flash memory devices. The flash controller increases the throughput of the one or more flash memory devices to match the speed of a host bus coupled to the MMC. To more particularly describe the features of the present invention, refer now to the following description in conjunction with the accompanying figures.

Although the present invention disclosed herein is described in the context of a memory card with examples based on a 4-bit MMC operating at 20 MHz, the present invention may apply to other memory devices and conditions and still remain within the spirit and scope of the present invention.

Figure 1:
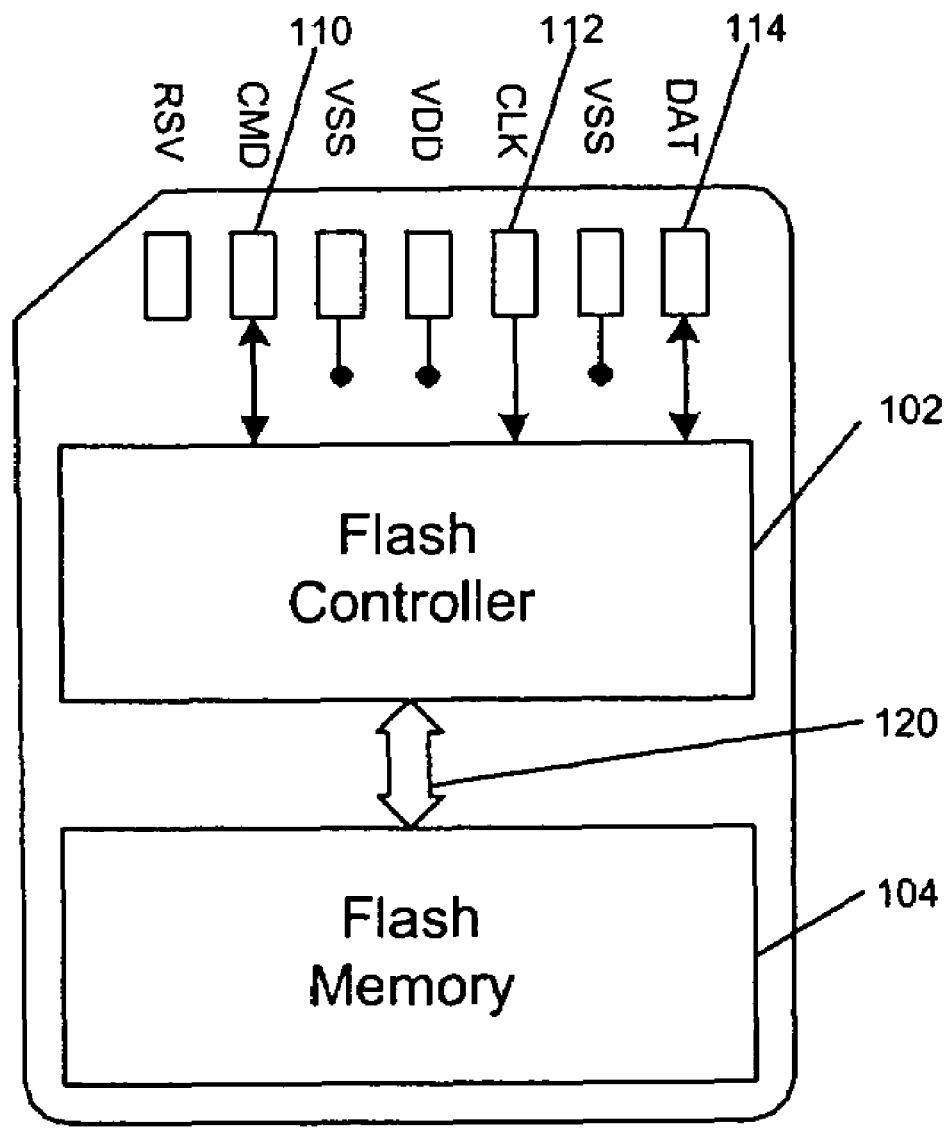
FIG. 1 is a block diagram of a multi media card (MMC) including a flash controller and a flash memory device in accordance with the present invention.

FIG. 1 is a block diagram of a multi media card (MMC) 100 including a flash controller 102 and a flash memory device 104 in accordance with the present invention. The flash controller 102 couples to a host bus (not shown) comprising a command pin 110, a clock pin 112, and a data pin 114. The flash controller 102 also couples to the flash memory device 104 via an internal bus 120. Note that the term flash memory is used interchangeably with the terms flash memory device and flash memory devices.

Figure 2:
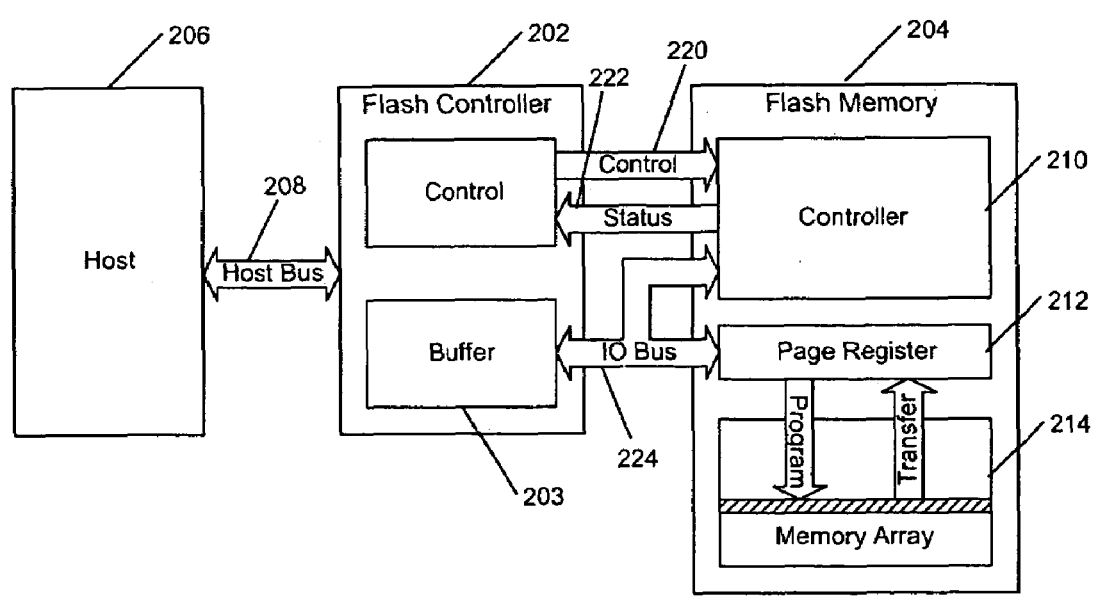
FIG. 2 is a block diagram of a flash controller and a flash memory device, which can be used to implement the MMC of FIG. 1 in accordance with the present invention.

FIG. 2 is a block diagram of a flash controller 202 and a flash memory device 204, which can be used to implement the MMC 100 of FIG. 1 in accordance with the present invention. The flash controller 202 couples to a host 206 via a host bus 208. The flash controller includes a buffer 203 for storing data before being sent to the host bus 208 or to the flash memory device 204. The flash memory device 204 includes an internal controller 210, a page register 212, and a memory array 214. The flash controller 202 interfaces with the flash memory device 204 via a control bus 220, a status bus 222, and an input/output (IO) bus 224. The IO bus 224 is a multiplex bus, through which commands, addresses, and data are transmitted. The IO bus 224 is hereinafter referred as the memory data bus or the data bus. The page register 212 interfaces with the memory array 214 to write to or read from memory array 214.

In a read cycle, generally, the flash controller 202 sends a read command and an address to the flash memory device 204, which then asserts a busy signal and transfers the data from the memory array 214 to the page register 212. When the transfer (i.e., read) is complete, the busy signal is de-asserted before the flash controller 202 begins reading the data from the page register 212.

In a write cycle, generally, the flash controller 202 sends a write command, address, and data to the flash memory device 204, the data is stored in the page register 212 first before the flash memory device 204 asserts the busy signal while programming the data into the memory array 214. When programming (i.e., write) is complete, the busy signal is de-asserted.

In accordance with the present invention, the read and write operations are described in more detail below.

A. Read Operations

Figure 3:
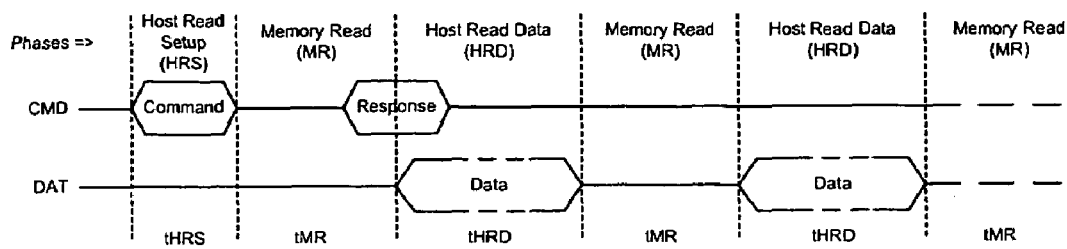
FIG. 3 is a high-level timing diagram of a multiple-block host read operation in accordance with the present invention.

FIG. 3 is a high-level timing diagram of a multiple-block host read operation in accordance with the present invention. The basic read operation begins with a host read setup phase, in which the flash controller receives a read command from the host, and returns a response if it is ready. In a subsequent memory read phase, the flash controller begins a memory read cycle to the flash memory. Once the data is ready, the flash controller sends data to the host in a host read data phase.

Figure 4:
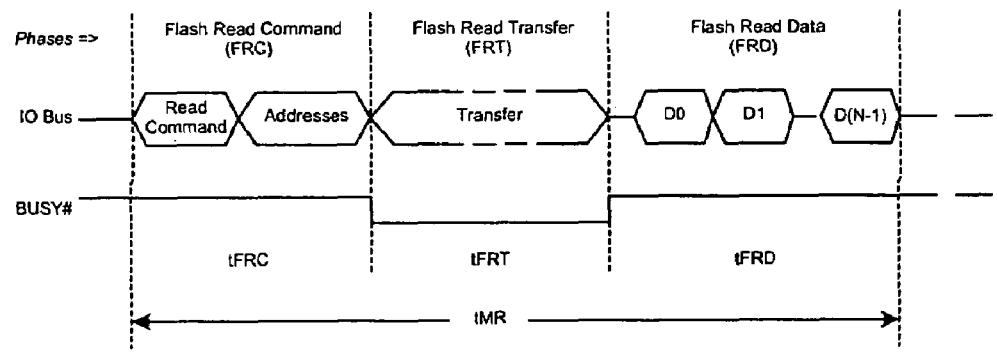
FIG. 4 is a detailed timing diagram of a flash memory read operation in accordance with the present invention.

FIG. 4 is a detailed timing diagram of a flash memory read operation in accordance with the present invention. FIG. 4 corresponds to the memory read phase (MR) of FIG. 3. First, the flash controller issues a read command to the flash memory. Upon receiving the read command, the flash memory transfers the data from the memory array to the page register. Once the data is ready, the flash controller reads the data into an internal buffer before the data is sent to the host.

The typical read operating conditions of the host and flash memory are as follows:

MMC host cycle time=50 ns (at operating frequency=20 Mhz),
MMC host data width=4,
Flash memory cycle time=50 ns,
Flash memory page size=512B.

The typical timing of each phase in the read operation is as follows:

Host read setup time (tHRS) 2.4 us,
Host read data time (tHRD)=51.2 us (without overhead),
Flash read command time (tFRC)=0.3 us,
Flash read transfer time (tFRT)=25 us,
Flash read data time (tFRD)=25.6 us (without overhead).

Figure 5:
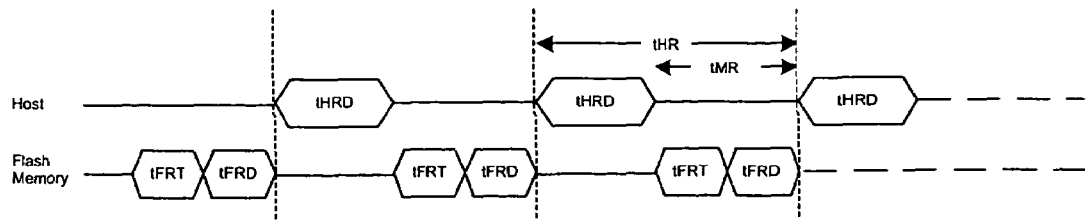
FIG. 5 shows a timing diagram of a typical memory read operation in accordance with the present invention.

FIG. 5 shows a timing diagram of a typical memory read operation in accordance with the present invention. The host read setup time (tHRS) and the flash read command time (tFRC) are negligible for sequential read access. As such:

The memory read time (tMR)=tFRT+tFRD=50.6 us,
The sequential host read time (tHR)=tMR+tHRD=101.8 us,
The sequential host read speed (SHRS)=(No. of bytes)/tHR=512/101.8=5.03 MB/s. This speed is just half of the MMC host bandwidth of 10.0 MB/s.

Accordingly, the reduction of the memory read time (tMR) improves the read speed. In accordance with the present invention, the following methods are applied in the flash controller to increase the read speed.

1. Read-Ahead Memory Read Operation

Figure 6:
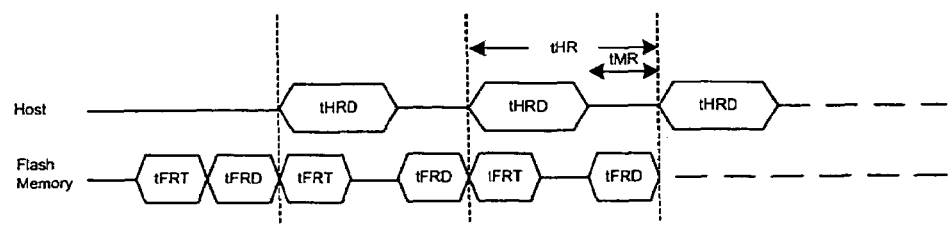
FIG. 6 shows a timing diagram of a read-ahead memory read operation in accordance with the present invention.

FIG. 6 shows a timing diagram of a read-ahead memory read operation in accordance with the present invention. As is shown, the flash controller sends the read command to the flash memory to begin the data transfer (tFRT) while the host is reading (tHRD) from the buffer in the flash controller the previous data read from the flash memory. Once the buffer is emptied, the flash controller immediately reads (tFRD) the next data from the flash memory into the buffer for delivery to host. For back-to-back read cycles, the effective memory read time (tMR) is equal to the flash read data time (tFRD). As such:

tMR=tFRD=25.6 us,
tHR=tMR+tHRD=25.6+51.2=76.8 us,
SHRS=512/76.8=6.67 MB/s, which is a 32.6% speed increase over the 5.03 MB/s of the typical sequential host read speed.

2. Larger Page Memory Read Operation

In accordance with the present invention, the size of the page register of the flash memory is enlarged such that a greater number of bytes can be transferred from the memory array to the page register over a certain period of flash read transfer time (tFRT). The throughput between the memory array to the page register is hence increased which in turn raises the overall read speed. For example, the Toshiba NAND flash memory with a 2048-byte page register has an identical flash read transfer time (tFRT) as the 512-byte version. Over the same period time, the internal data transfer speed of the 2048-byte version of the present invention is 4 times faster than the 512-byte version. The size of the page register can be increased even more to increase the read speed to match the speed of the host bus. For example, the size of the page register can be increased to 4096 bytes, 8192 bytes, or more, depending on the specific application.

To support a larger page size of 2048 bytes, the host will set the block length to 2048 bytes before commencing host read cycles. The corresponding timing is as follows:

tFRD (2048 bytes)=102.4 us,
tHRD (2048 bytes)=204.8 us,
tMR=tFRT+tFRD=25+102.4=127.4 us,
tHR=tMR+tHRD=127.4+204.8=332.2 us,
SHRS=2048/332.2=6.16 MB/s, which is a 22.47% speed increase over the 5.03 MB/s of the typical sequential host read speed.

3. Wider Data Bus Read Operation

In accordance with the present invention, the width of data bus is widened such that a greater number of bytes can be read from flash memory to flash controller via 10 bus at any instance, the effective flash read data time (tFRD) is therefore reduced. The throughput between flash controller and flash memory is hence increased which in turn raises the overall read speed. In a specific embodiment, for a fixed or certain amount of data bytes, a flash memory with a 16-bit data bus uses half of the flash read data time (tFRD) than a flash memory with an 8-bit data bus. The data bus size can be increased even more to increase the memory read speed to match the speed of the host bus. For example, the data bus size can be increased to 32 bits, or 64 bits, or more, depending on the specific application.

The typical flash memory data bus width is 8 bits, with the wider data bus, the flash read data time (tFRD) is reduced and the speed is higher. For example, when the flash memory with 2048-byte page and 16-bit data bus width is used, the timing is as follows:

tFRD (16 bits)=102.4/2=51.2 us,
tMR=tFRT+tFRD=25+51.2=76.2 us
tHR=tMR+tHRD=76.2+204.8=281.0 us,
SHRS=2048/281.0=7.29 MB/s, which is a 44.93% speed increase over the 5.03 MB/s of the typical sequential host read speed.

4. Dual-Channel Concurrent Memory Read Operation

The flash controller is designed with two chip enables or selects, each chip enable controls a flash memory device and the data is stored in both flash memory devices in an interleaved manner. During the data transfer state, the flash memory device informs flash controller via its individual busy signal if the data is ready.

Figure 7:
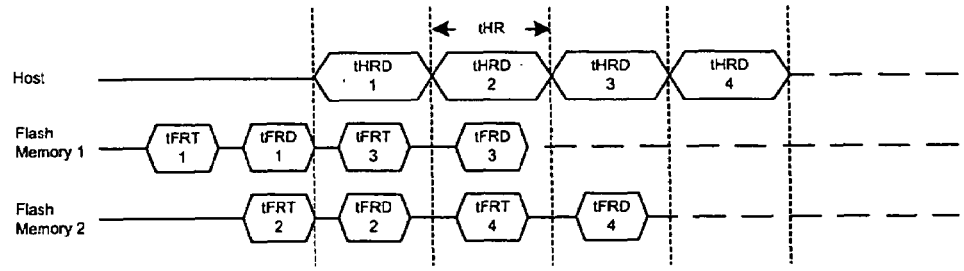
FIG. 7 shows a timing diagram of a dual-channel concurrent memory read operation in accordance with the present invention.

FIG. 7 shows a timing diagram of a dual-channel concurrent memory read operation in accordance with the present invention. As is shown, after a read command is issued to one of the flash memory devices (e.g., Flash Memory 1) to begin an internal data transfer (tFRT$_3$) from a memory array to the page register, the flash controller enables the other flash memory device (Flash Memory 2) to read data (tFRD$_2$) available corresponding to the previous read command via the flash memory data bus. As a result, the chip selects allow for multiple flash memories to be concurrently accessed. Accordingly, read concurrency is achieved among multiple flash memories. This concurrency effectively eliminates the memory read time (tMR) at the host bus. As such:

tHR=tHRD=51.2 us,
SHRS=512/51.2=1 0.0 MB/s, which is the full speed of host bus.

B. Write Operations

Figure 8:
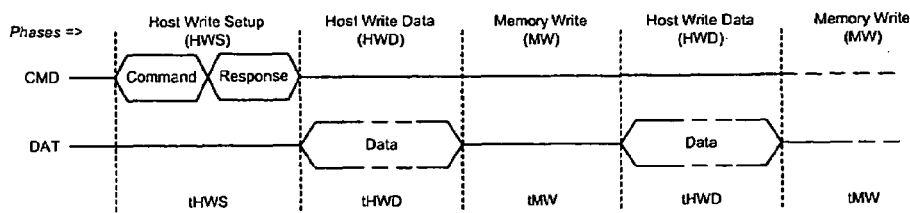
FIG. 8 shows a high-level timing diagram of a multiple-block host write operation in accordance with the present invention.

FIG. 8 shows a high-level timing diagram of a multiple-block host write operation in accordance with the present invention. The basic write operation begins with a host write setup phase, in which the flash controller receives the write command from the host. After a response is received, host delivers data to the flash controller. The memory write phase is followed, in which the flash controller begins memory write cycle to program data into the flash memory.

Figure 9:
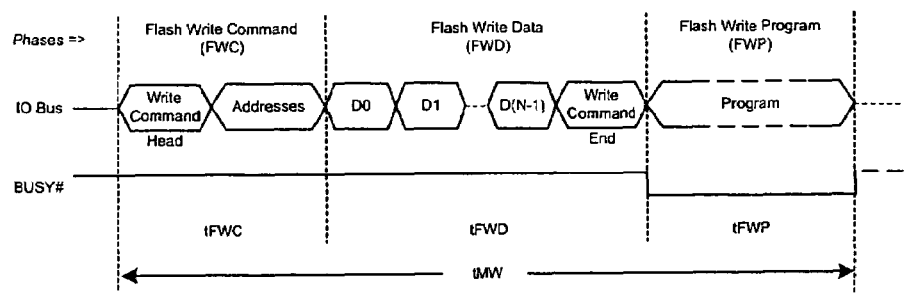
FIG. 9 shows a detailed timing diagram of a flash memory write operation in accordance with the present invention.

FIG. 9 shows a detailed timing diagram of a flash memory write operation in accordance with the present invention. FIG. 9 corresponds to the memory write phase (MW) of FIG. 8. After a write command is issued, the flash controller delivers data to fill the page register in the flash memory, which then programs the data into the memory array.

The typical write operating conditions of the host and flash memory:

MMC host cycle time=50 ns (at operating frequency=20 Mhz),
MMC host data width=4,
Flash memory cycle time=50 ns,
Flash memory page size=512B.

The typical timing of each phase in write operation is as follows:

Host write setup time (tHWS)=5.0 us,
Host write data time (tHWD)=51.2 us (without overhead),
Flash write command time (tFWC)=0.3 us,
Flash write program time (tFWP)=200 us,
Flash write data time (tFWD)=25.65 us (without overhead).

Figure 10:
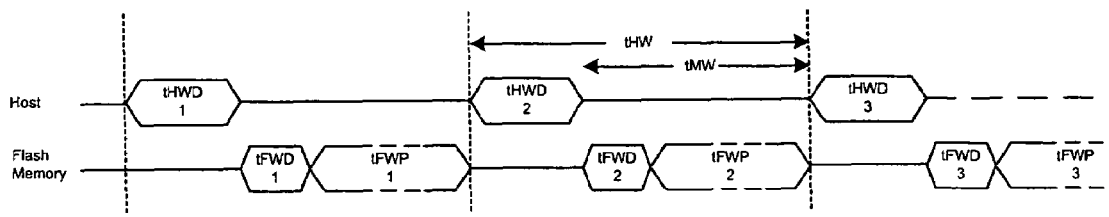
FIG. 10 shows a timing diagram of a typical memory write operation in accordance with the present invention.

FIG. 10 shows a timing diagram of a typical memory write operation in accordance with the present invention. The host write setup time (tHWS) and the flash write command time (tFWC) are negligible for sequential write cycles. As such:

The memory write time (tMW)=tFWD+tFWP=225.65 us,
The sequential host write time (tHW)=tHWD+tMW=276.85 us,
The sequential host write speed (SHWS)=(No. of bytes)/tHW=512/276.85=1.85 MB/s. This speed is much less than the MMC host bandwidth of 10.0 MB/s.

Accordingly, the reduction of the memory write time (tMW) improves write speed. In accordance with the present invention, the following methods are applied in the flash controller to increase the write speed.

1. Write-Ahead Memory Write Operation

Figure 11:
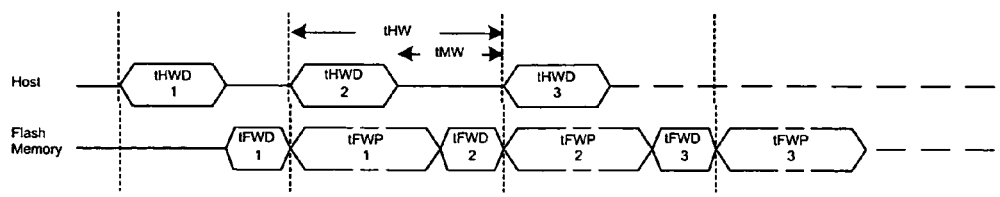
FIG. 11 is a timing diagram of a write-ahead memory write operation in accordance with the present invention.

FIG. 11 is a timing diagram of a write-ahead memory write operation in accordance with the present invention. As is shown, once the previous data has been emptied (tFWD$_1$) to flash memory, the host begins writing (tHWD$_2$) the next data to flash controller, while the previous data being programmed (tFWP$_1$) to the memory array in flash memory. For back-to-back write cycles, the effective memory write time (tMW) is reduced by the host write data time (tHWD). As such:

tMW=tFWD+tFWP−tHWD,
tHW=tFWD+tFWP=25.65+200=225.65 us,
SHWS=512/225.65=2.27 MB/s, which is a 22.7% speed increase over the 1.85 MB/s of the typical sequential host write speed.

2. Larger Page Memory Write Operation

In accordance with the present invention, the size of the page register of the flash memory is enlarged such that a greater number of bytes can be programmed from the page register to the memory array over a certain period of flash write program time (tFWP). The throughput between the page register to the memory array is hence increased which in turn raises the overall write speed. For example, the Toshiba NAND flash memory with a 2048-byte page register has an identical flash write program time (tFWP) as the 512-byte version. Over the same period time, the speed of the internal data program of 2048-byte version of the present invention is 4 times faster than the 512-byte version. The size of the page register can be increased even more to increase the write speed to match the speed of the host bus. For example, the size of the page register can be increased to 4096 bytes, 8192 bytes, or more, depending on the specific application.

To support a larger page, the host will set the block length to 2048 bytes before host write cycles. The corresponding timing is as follows:

tFWD (2048 bytes)=102.45 us,
tHWD (2048 bytes)=204.8 us,
tMW=tFWD+tFWP=102.45+200=302.45 us,
tHW=tHWD+tMW=204.8+302.45=507.25 us,
SHWS=2048/507.25=4.04 MB/s, which is a 118.38% speed increase over the
1.85 MB/s of the typical sequential host write speed.

With the write-ahead operation, the memory write time (tMW) is further reduced by the host write data time (tHWD). The timing is as follows:
tMW=tFWD+tFWP−tHWD,
tHW=tFWD+tFWP=102.4+200=304.8 us,
SHWS=2048/304.8=6.72 MB/s, which is a 263.24% speed increase over the
1.85 MB/s of the typical sequential host write speed.

3. Wider Data Bus Write Operation

In accordance with the present invention, the width of the data bus is widened such that a greater number of bytes can be written from the flash controller to the flash memory via the IO bus at in any instance, the effective flash write data time (tFWD) is therefore reduced. The throughput between the flash controller and the flash memory is hence increased which in turn raises the overall write speed. In a specific embodiment, for a fixed or certain amount of data bytes, the flash memory with 16-bit data width uses half of the flash write data time (tFWD) than the flash memory with an 8-bit data bus. The data bus size can be increased even more to increase the memory write speed to match the speed of the host bus. For example, the data bus size can be increased to 32 bits, or 64 bits, or more, depending on the specific application.

The typical flash memory data bus width is 8-bits, with the wider data bus, the flash write data time (tFWD) is reduced and the speed is higher. For example, when the flash memory with 2048-byte page and 16-bit data bus width is used, the timing is as follows:
tMW=tFWD (16 bits)+tFWP=102.45/2+200=251.23 us,
tHW=tHWD+tMW=204.8+251.23=456.03 us,
SHWS=2048/456.03=4.49 MB/s, which is a 142.7% speed increase over the
1.85 MB/s of the typical sequential host write speed.

4. Dual-Channel Concurrent Memory Write Operation

The flash controller is designed with two chip enables or selects, each chip enable controls a flash memory and the data are stored in both flash memories in an interleave manner. During the data program state, the flash memory informs flash controller via its individual busy signal when the program is done.

Figure 12:
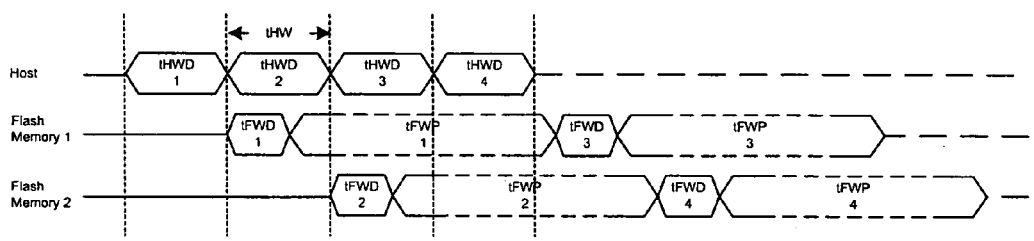
FIG. 12 is a timing diagram of dual-channel concurrent memory write operation in accordance with the present invention.

FIG. 12 is a timing diagram of a dual-channel concurrent memory write operation in accordance with the present invention. As is shown, the flash controller enables one of the flash memory devices (e.g., Flash Memory 2) to fill its page register (tFWD$_2$) via flash memory data bus while the other flash memory (Flash Memory 1) is programming (tFWP$_1$) the memory array with the data previously sent from the flash controller. The write concurrency is achieved among flash memories. This concurrency effectively eliminates the memory write time (tMW) at the host bus. As such:
tHW=tHWD=51.2 us,
SHWS=512/51.2=1 0.0 MB/s, which is the full speed of host bus.

5. Write-Cache Memory Write Operation

In accordance with the present invention the flash memory has a cache register in addition to a page register to pipeline extra data to be programmed into the memory array. While hundreds of microseconds are needed to move the data from the page register to the memory array, it takes only few microseconds to move data from the cache register to the page register. Such pipelining allows for the concurrency of memory write data and the memory program phases, which reduces the effective memory write time (tMW) at the host bus.

Figure 13:
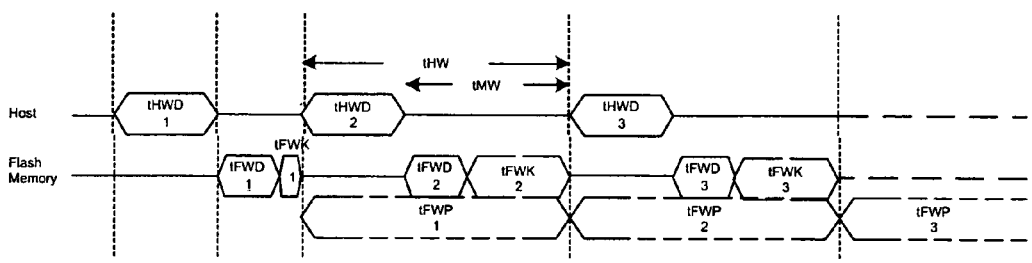
FIG. 13 is a timing diagram of a write-cache memory write operation in accordance with the present invention.

FIG. 13 is a timing diagram of a write-cache memory write operation in accordance with the present invention. For write operations, the data is first written (tFWD$_1$) to the cache register. Once the cache register has emptied (tFWK$_1$) the data to page register, it is ready to accept the next data (tFWD$_2$) from flash controller while the previous data in page register is being programming (tFWP$_1$) into the memory array.

For back-to-back write cycles, the effective memory write time (tMW) is the flash write program time (tFWP)–the host write data time (tHWD). As such:
tMW=tFWP−tHWD,
tHW=tHWD+tMW=tFWP=200 us,
SHWS=512/200=2.56 MB/s, which is 38.38% speed increase.

For 2048-byte flash memory, as the host write data time (tHWD) is long comparable to the flash write program time (tFWP), the effective memory write time (tMW) is the flash write data time (tFWD)+flash write cache time (tFWK). With the flash write cache time (tFWK) of 2 us, the timing is:
tMW=tFWD+(tFWK)=102.45+2=104.45 us,
tHW=tHWD+tMW=309.25 us,
SHWS=2048/309.25=6.62 MB/s, which is 257.84% speed increase.

In accordance with the present invention, the flash memory system increases the throughput of one or more flash memory devices by performing one or more of a read-ahead memory operation, a write-ahead memory write operation, a larger page memory write operation, a wider data bus memory write operation, a dual-channel concurrent memory read operation, a dual-channel concurrent memory write operation, a write-cache memory write operation, and any combination thereof.

C. Multi-Level Cell (MLC) Versus Single-Level Cell (SLC)

A typical flash memory device uses single-level cell (SLC) technology, which has only two possible voltage levels, corresponding to one bit (0 or 1) data. These two levels are controlled by the amount of charge that is programmed or stored on the floating gate. If the amount of charge on the floating gate is above a certain reference level, the cell is considered to be in a different level.

Multi-level cell (MLC) technology enables the storage of multiple bits per memory cell by charging the floating gate of a transistor to more than two levels by precisely controlled injection of electrical charges. A two-bit MLC has four voltage levels. A three-bit MLC has eight voltage levels. An N-bit MLC has $2^N$ voltage levels.

For the same geometry, flash memories using MLC technology effectively increase the density and reduce the cost. However the performance is degraded compared to flash memories using SLC technology, especially since the program time of MLC is about 5 times of the SLC. For cost reasons, MLC technology has been widely adopted in memory card arena. Accordingly, the ability for a flash controller to support and enhance the speed of flash memories using both SLC and MLC technologies is required.

The flash controller of the present invention supports hosts having different data widths, including but not limited to 1 bit, 4 bits, and 8 bits. The flash controller also supports single-level cell (SLC) and multi-level cell (MLC) flash memories.

Furthermore, the flash controller can be applied to flash memory devices comprising Secure Digital Card, Memory Stick Card, Compact Flash Card, USB Flash Drive, USB Flash Drive in Express Card mechanical form factor, PCI Express Drive in Express Card mechanical form factor. Furthermore, the flash controller can be applied to a variety of mass storage devices such as Serial ATA Flash hard drive, IDE Flash hard drive, SCSI Flash hard drive, and Ethernet Flash hard drive.

According to the system and method disclosed herein, the present invention provides numerous benefits. For example, the flash controller increases the speeds at which data is written to and read from memory devices. As a result, the overall speed performance of the memory devices are improved is achieved while maintaining backward compatibility.

A multi media card (MMC) is disclosed. The MMC comprises a flash controller and one or more flash memory devices. The flash controller increases the throughput of the one or more flash memory devices to match the speed of a host bus coupled to the MMC.

Although the present invention has been described in accordance with the embodiments shown, one of ordinary skill in the art will readily recognize that there could be variations to the embodiments and those variations would be within the spirit and scope of the present invention. Embodiments of the present invention can be implemented using hardware, software, a computer readable medium containing program instructions, or combination thereof. Accordingly, many modifications may be made by one of ordinary skill in the art without departing from the spirit and scope of the appended claims.

What is claimed is:

1. A multi media card (MMC) for use with a host device by way of a host bus having a predetermined speed, the MMC comprising:
    a card body having a plurality of pins disposed along an edge thereof for electrical connection to the host bus;
    a flash controller coupled to the plurality of pins; and
    at least one flash memory device coupled to the flash controller by way of an internal bus,
    wherein the flash controller comprises means for increasing a throughput of the at least one flash memory device to match the predetermined speed of a the host bus.

2. The MMC of claim 1 wherein the flash controller comprises means for performing a read-ahead memory read operation.

3. The MMC of claim 1 wherein the flash controller comprises means for performing a write-ahead memory write operation.

4. The MMC of claim 1,
    wherein the at least one flash memory device includes a page register having a size of at least 2048 bytes, and
    wherein the flash controller comprises means for increasing the throughput by matching the number of bytes per second transmitted between the host bus and the page register.

5. The MMC of claim 4 wherein the page register is one of 2048 bytes, 4096 bytes and 8192 bytes.

6. The MMC of claim 1,
    wherein the internal bus includes a memory data bus having a width of at least 16 bits, and
    wherein flash controller comprises means for increasing the throughput by matching the number of bits transmitted during each instance with the width of the memory data bus such that a greater number of bytes per second is transmitted between the host bus and the page register.

7. The MMC of claim 6 wherein the width of the memory data bus is one of 16 bits, 32 bits and 64 bits.

8. The MMC of claim 1 wherein the means for increasing throughput comprises means for performing at least one of a dual-channel concurrent memory read operation and a dual-channel concurrent memory write operation.

9. The MMC of claim 1 wherein the means for increasing throughput comprises means for performing a write-cache memory write operation.

10. The MMC of claim 1 wherein the means for increasing throughput comprises one or more of means for performing a read-ahead memory read operation, means for performing a write-ahead memory write operation, means for performing a dual-channel concurrent memory read operation, means for performing a dual-channel concurrent memory write operation, and means for performing write-cache memory write operation.

11. The MMC of claim 10 further comprising a page register having at least 2048 bytes, wherein said means for increasing throughput comprises means for transferring said at least 2048 bytes from the page register to the at least one flash memory device during a flash write data time, and means for transferring said at least 2048 bytes to the page register from the at least one flash memory device during a flash read data time.

12. The MMC of claim 10 wherein the internal bus includes a memory data bus having a width of at least 16 bits, and wherein said means for increasing throughput comprises means for simultaneously transferring at least 16 bits from the flash controller to the at least one flash memory device during a flash write data time, and means for simultaneously transferring at least 16 bits from the at least one flash memory device to the flash controller during a flash read data time.

13. The MMC of claim 1 wherein the flash controller supports the host bus with different data widths, including but not limited to 1 bit, 4 bits, and 8 bits.

14. The MMC of claim 1 wherein the flash controller comprises means for communicating with single-level cell (SLC) and multi-level cell (MLC) flash memories.

15. A flash memory system comprising: a host bus; a flash controller coupled to the host bus; and at least one flash memory device, wherein the flash controller comprises one or more of means for performing a read-ahead memory read operation, means for performing a write-ahead memory write operation, means for performing a dual-channel concurrent memory read operation, means for performing a dual-channel concurrent memory write operation, and means for performing a write-cache memory write operation.

16. The system of claim 15 wherein the page register comprises at least 2048 bytes.

17. The system of claim 15 wherein the flash controller supports the host bus with different data widths, including but not limited to 1 bit, 4 bits, and 8 bits.

18. The system of claim 15 wherein the flash controller comprises means for communicating with single-level cell (SLC) and multi-level cell (MLC) flash memories.

19. The system of claim 15, wherein the system comprises one of a Secure Digital Card, a Memory Stick Card, a Compact Flash Card, an USB Flash Drive, an USB Flash Drive in Express Card mechanical form factor, and a PCI Express Drive in Express Card mechanical form factor.

20. The system of claim 15 wherein the system comprises one of a Serial ATA Flash hard drive, an IDE Flash hard drive, a SCSI Flash hard drive, and an Ethernet Flash hard drive.

* * * * *